United States Patent
Hatakeyama et al.

(10) Patent No.: US 8,258,569 B2
(45) Date of Patent: Sep. 4, 2012

(54) NON-VOLATILE SEMICONDUCTOR MEMORY DEVICE

(75) Inventors: Masanori Hatakeyama, Yokohama (JP); Osamu Ikeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 383 days.

(21) Appl. No.: 12/563,287

(22) Filed: Sep. 21, 2009

(65) Prior Publication Data
US 2010/0224926 A1 Sep. 9, 2010

(30) Foreign Application Priority Data
Mar. 3, 2009 (JP) .................................. 2009-049367

(51) Int. Cl.
*H01L 29/66* (2006.01)
(52) U.S. Cl. . 257/319; 257/390; 257/506; 257/E29.129; 257/E21.687; 365/185.2; 438/275; 438/201
(58) Field of Classification Search .................. 257/296, 257/316, 319, 506, 390, E21.687, E29; 365/104, 365/185.2; 438/275, 201
See application file for complete search history.

(56) References Cited

U.S. PATENT DOCUMENTS

| | | | |
|---|---|---|---|
| 5,945,702 A * | 8/1999 | Nakanishi | 257/296 |
| 6,555,427 B1 | 4/2003 | Shimizu et al. | |
| 6,780,715 B2 * | 8/2004 | Jeong | 438/275 |
| 2004/0041202 A1 * | 3/2004 | Kim et al. | 257/316 |
| 2007/0138575 A1 | 6/2007 | Arai et al. | |
| 2008/0055978 A1 * | 3/2008 | Ishibashi et al. | 365/185.2 |
| 2008/0303115 A1 * | 12/2008 | Miyazaki et al. | 257/506 |

FOREIGN PATENT DOCUMENTS

| | | |
|---|---|---|
| JP | 2001-284556 | 10/2001 |
| JP | 2007-173462 | 7/2007 |
| JP | 2007-221084 | 8/2007 |
| JP | 2008-305901 | 12/2008 |

OTHER PUBLICATIONS

Office Action issued Jun. 14, 2011 in Japan Application No. 2009-049367 (With English Translation).

* cited by examiner

*Primary Examiner* — Jerome Jackson, Jr.
*Assistant Examiner* — Fang-Xing Jiang
(74) *Attorney, Agent, or Firm* — Oblon, Spivak, McClelland, Maier & Neustadt, L.L.P.

(57) ABSTRACT

A plurality of NAND cells are arranged in a cell array. In each of the NAND cells, a pair of selection gate transistors is connected in series to a plurality of memory cell transistors. An inter-gate connection trench is formed in an insulating film between layers of stacked gates of the selection gate transistors. The stacked gates are electrically connected to each other. At an end part of the cell array in the row direction, an STI area is formed, and dummy NAND cells are formed at an end part in the row direction. A dummy selection gate transistor is connected in series to a plurality of dummy memory cell transistors. No inter-gate connection trench is present in an insulating film between layers of stacked gates of the dummy selection gate transistor, and the stacked gates of the dummy selection gate transistor are not electrically connected to each other.

9 Claims, 3 Drawing Sheets

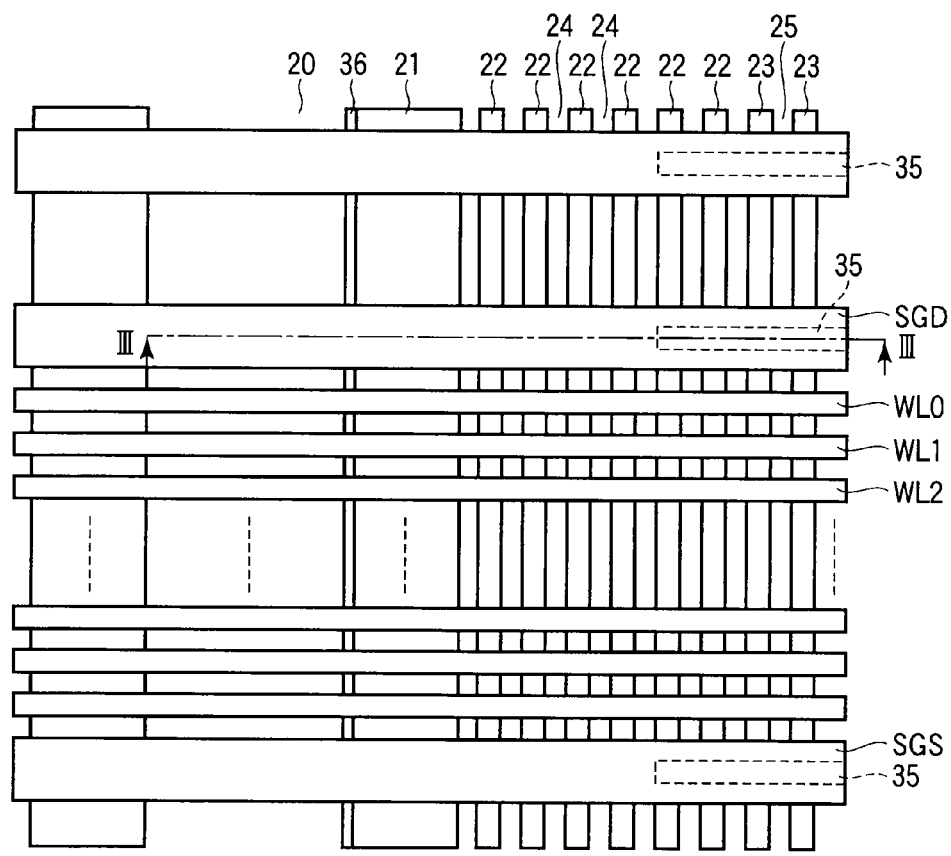
F I G. 2

NON-VOLATILE SEMICONDUCTOR MEMORY DEVICE

CROSS-REFERENCE TO RELATED APPLICATIONS

This application is based upon and claims the benefit of priority from prior Japanese Patent Application No. 2009-049367, filed Mar. 3, 2009, the entire contents of which are incorporated herein by reference.

BACKGROUND OF THE INVENTION

1. Field of the Invention

The present invention relates to a non-volatile semiconductor memory device and, more particularly, to a NAND flash memory in which each of memory cell transistors has a stacked gate structure constituted of a floating gate and control gate, and which includes an array of NAND memory cells each formed by connecting a pair of selection gate transistors in series to a plurality of memory cell transistors, and a stacked gate structure of a dummy NAND cell.

2. Description of the Related Art

In the cell array area of a NAND flash memory, a plurality of NAND memory cells (hereinafter referred to as NAND cells) is arranged in a matrix form. In each of the NAND cells, a plurality of non-volatile memory cell transistors is connected in series, and a selection gate transistor is connected to each of both ends of the plurality of memory cell transistors connected in series. Between NAND cells adjacent to each other in the row direction, an element isolation/insulation area (hereinafter referred to as an STI area) of a trench structure is formed. Each of the memory cell transistors has a stacked gate structure in which control gates are stacked on a floating gate via inter-gate insulating films (hereinafter referred to as IPD films) interposed between layers.

In Arai et al. (US2007/0138575), the following is described. That is, in a selection gate transistor, a lower gate electrode (in the same layer as the floating gate) and upper gate electrode (in the same layer as the control gate) are electrically connected to each other through an inter-gate connection trench opened in the IPD film.

Further, in MIYAZAKI et al. (US2008/03031115), the following is described. An STI area with a large width is formed on the substrate surface at an end part of a cell array area of a NAND flash memory in the row direction. A dummy element area, and a plurality of element areas are arranged in sequence adjacent to the STI area, and an STI area with a small width is arranged between the dummy element area and element area, and between element areas.

Further, in Shimizu et al. (U.S. Pat. No. 6,555,427), the following is described. In order to enhance the coupling ratio of the floating gate to control gate of a memory cell transistor, after formation of the STI area, the top surface of the insulating film of the STI area is recessed by isotropic or anisotropic etching, and the side surface of the floating gate is exposed. Areas other than the cell array area need not be etched, and hence are covered with a photoresist coating at the time of this process. The boundary of the photoresist coating is arranged in the dummy element area adjacent to the cell array side of the STI area with a large width. At the time of formation of the STI area, a pad nitride film is deposited on the element area. The pad nitride film and the surface of the insulating film of the STI area are planarized. Thereafter, the pad nitride film is removed. As a result of this, even after the above etching process, the STI area with the large width protrudes from the substrate surface of the adjacent dummy element area. The inter-gate connection trench opened in the IPD film between the upper gate electrode and lower gate electrode of the selection gate transistor is extended to a position of the dummy element area adjacent to the STI area with the large width.

When the cell array area of the NAND flash memory described above is formed, if the conventional mask layout is used, at a part in the STI area with the large width positioned at an end of the cell array area in the row direction, an etching remnant of the polysilicon film for the floating gate occurs in some cases in the column direction along the protrusion side surface of the step part protruding from the substrate surface. As a result of this, a short-circuit path for electrically connecting floating gates adjacent to each other in the column direction occurs along the STI area with the large width. Then, when a voltage is applied to a selection gate line connected to the selection gate transistor, the voltage is conducted to each floating gate of the memory cell transistors through the short-circuit path. As a result of this, a problem is caused as follows. That is, a high electric field is applied to the IPD film of the memory cell transistor, a breakdown of the IPD film occurs, further the high electric field is applied to the gate insulating film, and a breakdown of the gate insulating film is caused. Improvement of such a situation is desired.

BRIEF SUMMARY OF THE INVENTION

According to an aspect of the present invention, there is provided a non-volatile semiconductor memory device comprising:

a semiconductor substrate;

a plurality of memory cell transistors each of which includes a floating gate and a control gate, the floating gate serves as a charge storage layer, the floating gate being formed, via a gate insulating film, on an element area formed on the semiconductor substrate, the control gate being formed, via an inter-gate insulating film, on the floating gate, the transistors being connected in series in the column direction on the semiconductor substrate;

a selection gate transistor including a lower gate electrode and an upper gate electrode, the lower gate electrode being formed, via a gate insulating film, on an element area formed on the semiconductor substrate, the upper gate electrode being formed, via an inter-gate insulating film, on the lower gate electrode, the selection gate transistor further including an inter-gate connection trench being present in the inter-gate insulating film, and the upper gate electrode and lower gate electrode being electrically connected to each other through the inter-gate connection trench;

a cell array in which a plurality of NAND memory cells in each of which the selection gate transistor is connected to the plurality of memory cell transistors on the semiconductor substrate are arranged;

a plurality of word lines which are formed to extend in the row direction in the cell array, and each of which is connected to control gates of memory cell transistors in the same row in the cell array as common connection;

a selection gate line formed to extend in the row direction in the cell array, and connected to a gate electrode of the selection gate transistor as common connection;

a first dummy element area with a first width, positioned at an end part of the cell array in the row direction, and formed on the semiconductor substrate;

a first STI area positioned at an end part of the cell array in the row direction, and formed adjacent to the first dummy element area on the opposite side from the cell array on the semiconductor substrate to extend in the column direction;

a plurality of first dummy memory cell transistors which are arranged at positions at which the plurality of word lines and the first dummy element area intersect each other, each of which includes a floating gate, via a gate insulating film, on the semiconductor substrate, and includes a control gate, via an inter-gate insulating film, on the floating gate; and a first dummy selection gate transistor arranged at a position at which the selection gate line and the first dummy element area intersect each other, including a lower gate electrode, via a gate insulating film, on the semiconductor substrate, and including an upper gate electrode, via an inter-gate insulating film, on the lower gate electrode, wherein the lower gate electrode and the upper gate electrode of the first dummy selection gate transistor are electrically insulated from each other with the inter-gate insulating film.

BRIEF DESCRIPTION OF THE SEVERAL VIEWS OF THE DRAWING

FIG. 2 is a plan view showing the pattern layout in the vicinity of an end part of the cell array in FIG. 1 in the row direction.

DETAILED DESCRIPTION OF THE INVENTION

An embodiment of the present invention will be described below with reference to the accompanying drawings. In the description, parts which are common throughout all the drawings will be denoted by common reference symbols.

Figure 1:
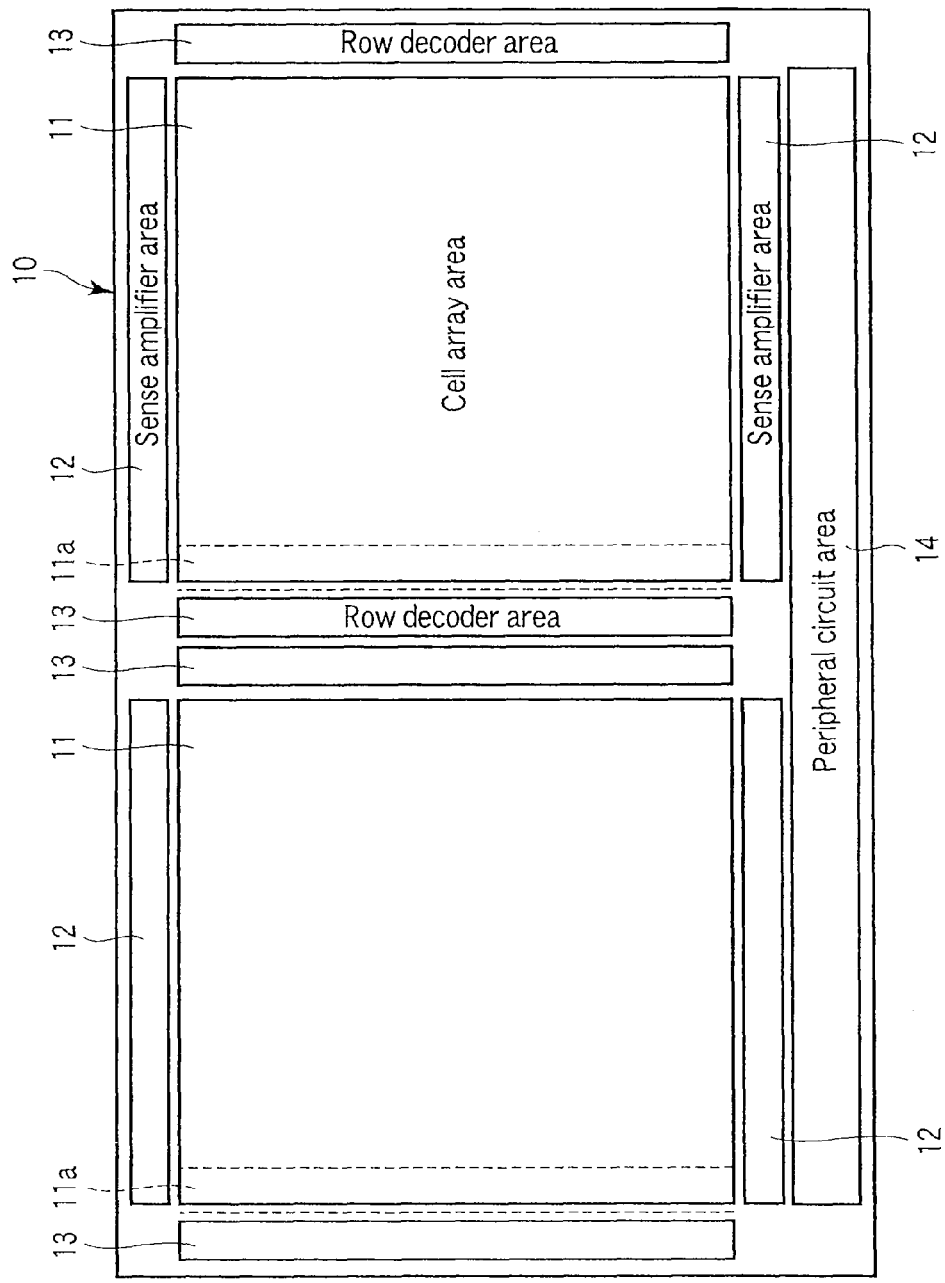
FIG. 1 is a plan view showing the pattern layout of the entire chip of a NAND flash memory according to an embodiment of the present invention.

FIG. 1 is a plan view showing the pattern layout of the entire chip of a NAND flash memory according to an embodiment of the present invention. A reference symbol 10 denotes a memory chip, each of reference symbols 11, 11 denotes a cell array area, each of reference symbols 11a, 11a denotes a row direction end part area of the cell array area, each of reference symbols 12, 12 denotes a sense amplifier area, each of reference symbols 13, 13 denotes a row decoder area, and a reference symbol 14 denotes a peripheral circuit area. A plurality of NAND cells is arranged in each cell array area 11 in a matrix form. Each NAND cell includes a memory cell transistor string in which a plurality of non-volatile memory cell transistors is connected in series, and selection gate transistors each of which is connected to each of both ends of the memory cell transistor string.

Figure 3:
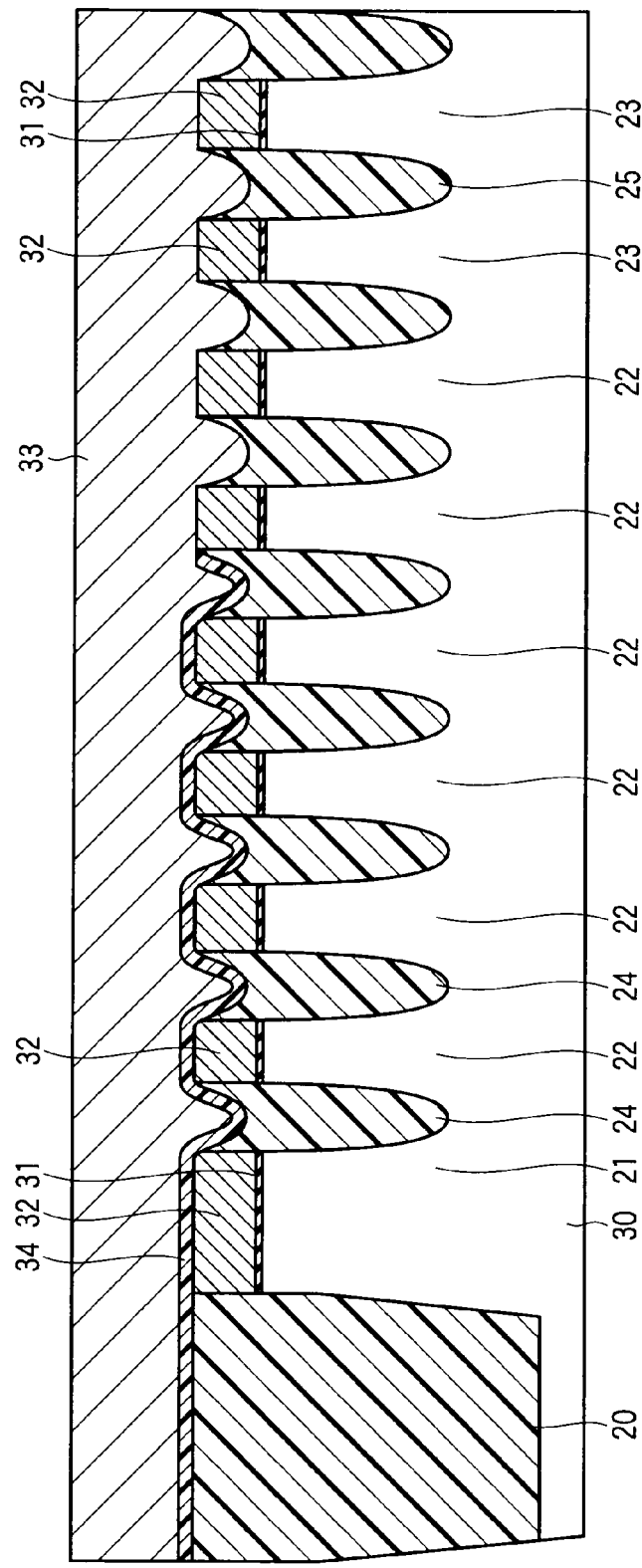
FIG. 3 is a cross-sectional view showing the structure along the selection gate line in FIG. 2.

FIG. 2 is a plan view showing the pattern layout in the vicinity of a row direction end part area 11a of one cell array area 11 in FIG. 1. Further, FIG. 3 is a cross-sectional view along line III-III on the first selection gate line SGD in FIG. 2. In the row direction end part area of the cell array area, a STI area 20 with a large width, a dummy element area 21 with a large width, and a plurality of dummy element areas 22 with small widths are formed on the substrate surface in such a manner that these areas are respectively arranged to extend in the column direction. A plurality of element areas 23 are formed closer to the inside of the cell array than the plurality of dummy element areas 22 in such a manner that the areas 23 respectively arranged to extend in the column direction. Between the dummy element areas 21 and 22, and between the plurality of dummy element areas 22, STI areas 24 with small widths are formed. A plurality of STI areas 25 with small widths are formed between the element areas 23 adjacent to each other, respectively. In a direction (row direction of the cell array area) intersecting the direction in which the dummy element areas 21, 22, and element areas 23 extend, a first selection gate line SGD, and a second selection gate line SGS are formed to extend in the above direction.

FIG. 3 shows a cross-sectional structure in the vicinity of the row direction end part of the cell array area. Here, a reference symbol 30 denotes a silicon substrate (including a well region), 31 denotes a gate insulating film, and 32 denotes a lower gate electrode of the selection gate transistor of the NAND cell or dummy NAND cell. A reference symbol 33 denotes an upper gate electrode of the selection gate transistor of the NAND cell or dummy NAND cell, and the upper gate electrode is connected to the first selection gate line SGD. A reference symbol 34 denotes an insulating film (IPD film) between the lower gate electrode and upper gate electrode of the selection gate transistor. A reference symbol 35 denotes an inter-gate connection trench formed in part of the IPD film 34.

As shown in FIG. 2, in the row direction of the cell array area, word lines WLi (=WL0, WL1, . . . ) connected to the control gate of the memory cell transistor of the NAND cell, selection gate lines SGD and SGS connected to the selection gate of the selection gate transistor, and source line (not shown) connected to one end side of the NAND cell are formed. In the column direction of the cell array area, bit lines (not shown) connected to the other end side of the NAND cell are formed.

In each of the NAND cell formed in the element area 23, and dummy NAND cell formed in each of the dummy element areas 21 and 22, in a plurality of memory cell transistors, transistors adjacent to each other in the column direction share one source region and the other drain region with each other, a drain region on one end side of the memory cell transistor string is connected to a source region of the first selection gate transistor, and a source region on the other end side of the memory cell transistor string is connected to a drain region of the second selection gate transistor.

Each memory cell transistor of the NAND cell is formed at an intersection area part of the word lines WLi and element areas 23. Each selection gate transistor of the NAND cell is formed at an intersection area part of the selection gate lines SGD, SGS and element areas 23.

Each memory cell transistor of the dummy NAND cell is formed at an intersection area part of the word lines WLi and dummy element areas 21, 22. Each selection gate transistor of the dummy NAND cell is formed at an intersection area part of the selection gate lines SGD, SGS and dummy element areas 21, 22. Control gates of memory cell transistors in the same row are connected to any part of the word line WLi as common connection. Selection gates of first selection gate transistors in the same row are connected to the first selection gate line SGD as common connection. Selection gates of second selection gate transistors in the same row are connected to the second selection gate line SGS as common connection.

Further, in NAND cells in the same column, drain regions of first selection gate transistors on one end side are connected to the same bit line as common connection, and source regions of second selection gate transistors on the other end side are connected to a source line as common connection.

In a memory cell transistor of the NAND cell, a floating gate as a charge storage layer is formed on the silicon substrate via a gate insulating film at an intersection area part of the word line WLi and element area 23, and a control gate is formed on the floating gate via an IPD film. In a memory cell transistor of the dummy NAND cell, a floating gate as a charge storage layer is formed on the silicon substrate via a gate insulating film at an intersection area part of the word line WLi and dummy element area 21, 22, and a control gate is formed on the floating gate via an IPD film. In each of these memory cell transistors, the floating gate is formed under the control gate via the IPD film, and the control gate and floating gate are insulated from each other with the IPD film 34.

On the other hand, as shown in FIG. 3, in the selection gate transistor of the NAND cell, a lower gate electrode 32 is formed on the silicon substrate 30 via a gate insulating film 31 at an intersection area part of the selection gate line SGD, SGS, and element area 23, and an upper gate electrode 33 is formed on the lower gate electrode 32 via an IPD film 34. An inter-gate connection trench 35 is formed in part of the IPD film 34 under the lower gate electrode 33. The upper gate electrode 33 and the lower gate electrode 32 are electrically connected to each other through the trench 35.

Conversely, in the selection gate transistor of the dummy NAND cell, a lower gate electrode 32 is formed on the silicon substrate 30 via a gate insulating film 31 at an intersection area part of the selection gate line SGD, SGS, and dummy element area 21, 22, and an upper gate electrode 33 is formed on the lower gate electrode 32 via an IPD film 34. In this embodiment, among the selection gate transistors of the dummy NAND cell formed in the plurality of dummy element areas 21, 22 in the vicinity of the end part in the row direction, in the selection gate transistor formed in each of a plurality of (five in this example) dummy element areas 21, 22 including the dummy element area 21 with the large width at the end part in the row direction, an inter-gate connection trench 35 is not formed in the IPD film 34 under the upper gate electrode 33, and the upper gate electrode 33 and lower gate electrode 32 are electrically insulated from each other with the IPD film 34. Further, in the selection gate transistor formed in each of the remaining dummy element areas 22, an inter-gate connection trench 35 is formed in part of the IPD film 34 under the upper gate electrode 33, and the upper gate electrode 33 and lower gate electrode 32 are electrically connected to each other through the trench 35.

At the time of formation of the cell array area of the NAND flash memory configured as described above, the STI areas 20, 24, and 25, and gate insulating film 31 are formed on the surface of the semiconductor substrate 30, thereafter a polysilicon film doped with impurities used for formation of the floating gate and lower gate electrode is deposited, and this polysilicon film is processed by anisotropic etching (normally, Reactive Ion Etching (RIE)), whereby a plurality of floating gate layers is formed in the column direction. Thereafter, an IPD film 34 is deposited, and an inter-gate connection trench 35 is opened in part of the IPD film 34 on the lower gate electrode 32 of the selection gate transistor. At this time, in order to realize the structure of this embodiment, an opening part of an etching mask used to form the inter-gate connection trench 35 is shifted from the dummy element area 21 toward the inside of the cell array. In this embodiment, as shown in FIG. 2, the mask layout is changed in such a manner that the mask is shifted by an amount corresponding to five dummy element areas. A change in the process is hardly caused.

Further, a polysilicon film doped with impurities used for formation of the control gate and upper gate electrode is deposited, and the polysilicon film, IPD film 34, and floating gate layer are processed by anisotropic etching (normally, RIE). In order to reduce the electric resistance of the control gate, a silicide film such as CoSi, NiSi, and the like may be deposited on the polysilicon film. As a result of this, a plurality of word lines WLi and selection gate lines SGD, SGS are formed in the row direction, and a plurality of floating gates 32 is formed. At this time, as shown in FIG. 2, at a part in the STI area 20 positioned at an end of the cell array area in the row direction, an etching remnant 36 of the polysilicon film for the floating gate occurs in some cases in the column direction along the protrusion side surface of the step part protruding from the substrate surface. More specifically, along the protruding side surface of the STI area 20 at an end part in the row direction, between lower gate electrodes of selection gate transistors adjacent to each other in the column direction, and floating gates of memory cell transistors adjacent to the selection gate transistors, and between floating gates of two memory cell transistors adjacent to each other in the column direction, an etching remnant 36 of the polysilicon film occurs in some cases. When the etching remnant 36 occurs, lower gate electrodes adjacent to each other in the column direction, and a plurality of floating gates are mutually and electrically short-circuited.

However, according to the structure of this embodiment, in the IPD film 34 of the selection gate transistor formed in the dummy element area 21 positioned at an end part in the row direction, no inter-gate connection trench 35 is present. As a result of this, even when an etching remnant 36 occurs, the lower gate electrode 32 of the selection gate transistor and the upper gate electrode 33 are not electrically short-circuited.

Accordingly, even when a short-circuit path is present due to the etching remnant 36 of the polysilicon film for floating gate formation, if a selection voltage is applied to the selection gate line SGD of the selection gate transistor, the voltage of the selection gate line SGD is not conducted to the floating gate of the memory cell transistor through the short-circuit path. As a result of this, a high electric field is not applied to the IPD film 34 of the memory cell transistor, the IPD film 34 and gate insulating film 31 can be prevented from being broken down, and the non-defective product yield is improved.

A detailed description will be given of this. Now, a case is assumed where data is written to a memory cell transistor corresponding to, for example, the word line WL2 in the NAND cell. At this time, a selection gate line SGD of the selection gate transistor in the NAND cell which is the write object is set at 0 V, a predetermined voltage is applied to non-selected word lines WL0, WL1, WL3, . . . , and the corresponding memory cell transistors are turned on. A write voltage higher than the voltage of the non-selected word lines WL0, WL1, WL3, . . . is applied to the selected word line WL2. As shown in FIG. 2, in the selection gate transistors in the dummy element area 21 positioned at an end part in the row direction, and several dummy element areas 22 adjacent thereto, no inter-gate connection trench 35 is formed in the IPD film 34. Accordingly, in each of these selection gate transistors, the lower gate electrode 32 is insulated from the selection gate line SGD, SGS by the IPD film 34. Even when a short-circuit path is present due to the etching remnant 36 of the polysilicon film for floating gate formation along the side surface of the STI area 20 positioned at the end part of the cell array area in the row direction, the voltage 0 V of the selection gate line SGD is not conducted to the floating gate of the memory cell transistor corresponding to the word line WL2 through this short-circuit path. Accordingly, in the memory cell transistor corresponding to the word line WL2, a high electric field is not applied to the IPD film 34, and hence breakdown of the IPD film 34 does not occur. Further, a high electric field is not also applied to the gate insulating film 31 under the floating gate, and the gate insulating film 31 is prevented from being broken down. As a result, the non-defective product yield is improved.

What is claimed is:

1. A non-volatile semiconductor memory device comprising:
   a semiconductor substrate;
   a plurality of memory cell transistors each of which includes a floating gate and a control gate, the floating gate serves as a charge storage layer, the floating gate being formed, via a gate insulating film, on an element area formed on the semiconductor substrate, the control gate being formed, via an inter-gate insulating film, on the floating gate, the plurality of memory cell transistors being connected in series in a column direction of the semiconductor substrate;
   selection gate transistors each including a lower gate electrode and an upper gate electrode, the lower gate electrode being formed, via a gate insulating film, on an element area formed on the semiconductor substrate, the upper gate electrode being formed, via an inter-gate insulating film, on the lower gate electrode, each of the selection gate transistors further including an inter-gate connection via being present in the inter-gate insulating film, and the upper gate electrode and lower gate electrode being electrically connected to each other through the inter-gate connection via;
   a cell array in which a plurality of NAND memory cells in each of which one of the selection gate transistors is connected to the plurality of memory cell transistors on the semiconductor substrate are arranged;
   a plurality of word lines which are formed to extend in the row direction in the cell array, and each of which is connected to control gates of memory cell transistors in the same row in the cell array as common connection;
   a selection gate line formed to extend in the row direction in the cell array, and connected to the upper gate electrode of each of the selection gate transistors as common connection;
   a first dummy element area with a first width, positioned at an end part of the cell array in the row direction, and formed on the semiconductor substrate;
   a first STI area positioned at an end part of the cell array in the row direction, and formed adjacent to the first dummy element area on the opposite side from the cell array on the semiconductor substrate to extend in the column direction;
   a plurality of first dummy memory cell transistors disposed on the first dummy element area and which are arranged at positions at which the plurality of word lines and the first dummy element area intersect each other, each of which includes a floating gate, on the semiconductor substrate, and includes a control gate, via an inter-gate insulating film, on the floating gate; and
   a first dummy selection gate transistor disposed on the first dummy element area and arranged at a position at which the selection gate line and the first dummy element area intersect each other, including a lower gate electrode, via a gate insulating film, on the semiconductor substrate, and including an upper gate electrode, via an inter-gate insulating film, on the lower gate electrode,
   a plurality of second dummy element areas which are positioned at an end part of the cell array in the row direction, are formed between the first dummy element area and the cell array, the plurality of second dummy element areas being formed on the semiconductor substrate to extend in the column direction, and each of which is provided with a second width smaller than the first width;
   a plurality of second STI areas which are formed between the first dummy element area and the second dummy element areas next to the first dummy element area, and between the plurality of second dummy element areas, the plurality of second STI areas being formed on the semiconductor substrate to extend in the column direction, and each of which is provided with a width smaller than that of the first STI area; and
   a plurality of second dummy selection gate transistors disposed on the second dummy element areas and which are arranged at positions at which the selection gate line and the plurality of second dummy element areas intersect each other, each of which includes a lower gate electrode, via a gate insulating film, on the semiconductor substrate, and includes an upper gate electrode, via an inter-gate insulating film, on the lower gate electrode,
   wherein the lower gate electrode and the upper gate electrode of the first dummy selection gate transistor are electrically insulated from each other with the inter-gate insulating film,
   in each of second dummy selection gate transistors formed in part of a plurality of second dummy element areas closer to the first dummy element area, the lower gate electrode and upper gate electrode are electrically insulated from each other with the inter-gate insulating film.

2. The device according to claim 1, wherein the first width is a length parallel with the row direction in the cell array.

3. The device according to claim 1, wherein the second width is a length parallel with the row direction in the cell array.

4. The device according to claim 1, wherein the floating gate is the same material as the lower gate electrode, and the control gate is the same material as the upper gate electrode.

5. A non-volatile semiconductor memory device comprising:
   a semiconductor substrate;
   a plurality of memory cell transistors each of which includes a floating gate and a control gate, the floating gate serves as a charge storage layer, the floating gate being formed, via a gate insulating film, on an element area formed on the semiconductor substrate, the control gate being formed, via an inter-gate insulating film, on the floating gate, the plurality of memory cell transistors being connected in series in a column direction of the semiconductor substrate;
   selection gate transistors each including a lower gate electrode and an upper gate electrode, the lower gate electrode being formed, via a gate insulating film, on an element area formed on the semiconductor substrate, the upper gate electrode being formed, via an inter-gate insulating film, on the lower gate electrode, each of the selection gate transistors further including an inter-gate connection via being present in the inter-gate insulating film, and the upper gate electrode and lower gate electrode being electrically connected to each other through the inter-gate connection via;
   a cell array in which a plurality of NAND memory cells in each of which the selection gate transistors is connected to the plurality of memory cell transistors on the semiconductor substrate are arranged;
   a plurality of word lines which are formed to extend in the row direction in the cell array, and each of which is connected to control gates of memory cell transistors in the same row in the cell array as common connection;

a selection gate line formed to extend in the row direction in the cell array, and connected to the upper gate electrode of each of the selection gate transistors as common connection;

a first dummy element area with a first width, positioned at an end part of the cell array in the row direction, and formed on the semiconductor substrate;

a first STI area positioned at an end part of the cell array in the row direction, and formed adjacent to the first dummy element area on the opposite side from the cell array on the semiconductor substrate to extend in the column direction;

a plurality of first dummy memory cell transistors disposed on the first dummy element area which are arranged at positions at which the plurality of word lines and the first dummy element area intersect each other, each of which includes a floating gate, via a gate insulating film, on the semiconductor substrate, and includes a control gate, via an inter-gate insulating film, on the floating gate;

a first dummy selection gate transistor disposed on the first dummy element area arranged at a position at which the selection gate line and the first dummy element area intersect each other, including a lower gate electrode, on the semiconductor substrate, and including an upper gate electrode, via an inter-gate insulating film, on the lower gate electrode, a plurality of second dummy element areas which are positioned at an end part of the cell array in the row direction, are formed between the first dummy element area and the cell array, the plurality of second dummy element areas being formed on the semiconductor substrate to extend in the column direction, and each of which is provided with a second width smaller than the first width;

a plurality of second STI areas which are formed between the first dummy element area and the second dummy element areas next to the first dummy element area, and between the plurality of second dummy element areas, the plurality of second STI areas being formed on the semiconductor substrate to extend in the column direction, and each of which is provided with a width smaller than that of the first STI area; and a plurality of second dummy selection gate transistors disposed on the second dummy element areas and which are arranged at positions at which the selection gate line and the plurality of second dummy element areas intersect each other, each of which includes a lower gate electrode, via a gate insulating film, on the semiconductor substrate, and includes an upper gate electrode, via an inter-gate insulating film, on the lower gate electrode, wherein the inter-gate connection via is formed to extend from the cell array to a part above a second STI area adjacent to the first dummy element area on the cell array side, in each of second dummy selection gate transistors formed in part of a plurality of second dummy element areas closer to the first dummy element area, the lower gate electrode and upper gate electrode are electrically insulated from each other with the inter-gate insulating film.

6. The device according to claim 5, wherein the floating gate is the same material as the lower gate electrode, and the control gate is the same material as the upper gate electrode.

7. A non-volatile semiconductor memory device comprising:

a semiconductor substrate;

a plurality of memory cell transistors each of which includes a floating gate and a control gate, the floating gate serves as a charge storage layer, the floating gate being formed, via a gate insulating film, on an element area formed on the semiconductor substrate, the control gate being formed, via an inter-gate insulating film, on the floating gate, the plurality of memory cell transistors being connected in series in a column direction of the semiconductor substrate;

selection gate transistors each including a lower gate electrode and an upper gate electrode, the lower gate electrode being formed, via a gate insulating film, on an element area formed on the semiconductor substrate, the upper gate electrode being formed, via an inter-gate insulating film, on the lower gate electrode, each of the selection gate transistors further including an inter-gate connection via being present in the inter-gate insulating film, and the upper gate electrode and lower gate electrode being electrically connected to each other through the inter-gate connection via;

a cell array in which a plurality of NAND memory cells in each of which the selection gate transistors is connected to the plurality of memory cell transistors on the semiconductor substrate are arranged;

a plurality of word lines which are formed to extend in the row direction in the cell array, and each of which is connected to control gates of memory cell transistors in the same row in the cell array as common connection;

a selection gate line formed to extend in the row direction in the cell array, and connected to the upper gate electrode of each of the selection gate transistors as common connection;

a first dummy element area with a first width, positioned at an end part of the cell array in the row direction, and formed on the semiconductor substrate;

a first STI area positioned at an end part of the cell array in the row direction, and formed adjacent to the first dummy element area on the opposite side from the cell array on the semiconductor substrate to extend in the column direction;

a plurality of first dummy memory cell transistors disposed on the first dummy element area and which are arranged at positions at which the plurality of word lines and the first dummy element area intersect each other, each of which includes a floating gate, via a gate insulating film, on the semiconductor substrate, and includes a control gate, via an inter-gate insulating film, on the floating gate;

a first dummy selection gate transistor disposed on the first dummy element area and arranged at a position at which the selection gate line and the first dummy element area intersect each other, including a lower gate electrode, on the semiconductor substrate, and including an upper gate electrode, via an inter-gate insulating film, on the lower gate electrode;

a plurality of second dummy element areas which are positioned at an end part of the cell array in the row direction, are formed between the first dummy element area and the cell array, are formed on the semiconductor substrate in that the second dummy element areas are arranged to extend in the column direction, and each of which is provided with a second width smaller than the first width;

a plurality of second STI areas which are formed between the first dummy element area and the second dummy element areas next to the first dummy element area, and between the plurality of second dummy element areas, are formed on the semiconductor substrate to extend in the column direction, and each of which is provided with a width smaller than that of the first STI area;

a plurality of second dummy memory cell transistors disposed on the second dummy element areas which are arranged at positions at which the plurality of word lines and the plurality of second dummy element areas intersect each other, each of which includes a floating gate, via a gate insulating film, on the semiconductor substrate, and includes a control gate, via an inter-gate insulating film, on the floating gate; and a plurality of second dummy selection gate transistors disposed on the second dummy element areas which are arranged at positions at which the selection gate line and the plurality of second dummy element areas intersect each other, each of which includes a lower gate electrode, on the semiconductor substrate, and includes an upper gate electrode, via an inter-gate insulating film, on the lower gate electrode, wherein the inter-gate connection via is formed to extend from the cell array and reach a position of part of the plurality of second dummy selection gate transistors.

8. The device according to claim 7, wherein each of the first and second widths is a length parallel with the row direction in the cell array.

9. The device according to claim 7, wherein the floating gate is the same material as the lower gate electrode, and the control gate is the same material as the upper gate electrode.

* * * * *